United States Patent
Miyasaka

(10) Patent No.: US 9,136,209 B2
(45) Date of Patent: Sep. 15, 2015

(54) SEMICONDUCTOR DEVICE WITH SPECIFIC LEAD FRAME FOR A POWER SEMICONDUCTOR MODULE

(75) Inventor: Toshiyuki Miyasaka, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 13/978,456

(22) PCT Filed: Nov. 14, 2011

(86) PCT No.: PCT/JP2011/076141
§ 371 (c)(1),
(2), (4) Date: Jul. 12, 2013

(87) PCT Pub. No.: WO2012/093521
PCT Pub. Date: Jul. 12, 2012

(65) Prior Publication Data
US 2013/0285221 A1    Oct. 31, 2013

(30) Foreign Application Priority Data
Jan. 7, 2011    (JP) .................................. 2011-002354

(51) Int. Cl.
*H01L 23/498*    (2006.01)
*H01L 23/04*    (2006.01)
(Continued)

(52) U.S. Cl.
CPC .......... *H01L 23/49568* (2013.01); *B23K 26/02* (2013.01); *B23K 26/032* (2013.01); *B23K 26/22* (2013.01); *B23K 26/32* (2013.01); *H01L 23/3735* (2013.01); *H01L 24/37* (2013.01);
(Continued)

(58) Field of Classification Search
CPC ......... H01L 23/24; H01L 24/40; H01L 25/40; H01L 2224/48091; H01L 2224/4813; H01L 2224/48227; H01L 2224/4911; H01L 224/73265; H01L 2924/01004; H01L 2924/01013; H01L 2924/01029; H01L 2924/01033; H01L 2924/01078; H01L 24/48; H01L 24/491
USPC ........ 257/675, 693, E23.01, E21.5, 726, 723, 257/712, 717, 690, 691, 787, 728, 719, 257/713; 219/121.64
See application file for complete search history.

(56) References Cited

U.S. PATENT DOCUMENTS 7,705,443 B2    4/2010    Yokomae et al.
7,944,042 B2 *  5/2011    Yoshihara et al. ............ 257/693
(Continued)

FOREIGN PATENT DOCUMENTS

JP    H11-066968 A    3/1999
JP    2008-028286 A    2/2008
(Continued)

*Primary Examiner* — Alexander Oscar Williams
(74) *Attorney, Agent, or Firm* — Manabu Kanesaka

(57) ABSTRACT

A semiconductor device has a heat dissipating base; a patterned insulating substrate attached to the heat dissipating base with a solder therebetween; a semiconductor chip attached to a conductive pattern of the patterned insulating substrate with a solder therebetween; a first conductor attached to the semiconductor chip with a solder therebetween; a resin case attached to the heat dissipating base with an adhesive; and a second conductor attached to the first conductor by laser welding. The second conductor formed by rolling has stripe-shaped rolling traces formed on a surface thereof in a rolling direction and is disposed on the first conductor such that the rolling traces are arranged in a same direction.

4 Claims, 13 Drawing Sheets

(51) Int. Cl.
*H01L 25/18* (2006.01)
*H01L 23/495* (2006.01)
*H01L 23/373* (2006.01)
*H01L 25/07* (2006.01)
*H01L 25/00* (2006.01)
*H01L 23/00* (2006.01)
*B23K 26/32* (2014.01)
*B23K 26/02* (2014.01)
*B23K 26/03* (2006.01)
*B23K 26/22* (2006.01)
*H01L 23/36* (2006.01)

(52) U.S. Cl.
CPC ............... *H01L 24/41* (2013.01); *H01L 24/84* (2013.01); *H01L 25/072* (2013.01); *H01L 25/50* (2013.01); *H01L 23/36* (2013.01); *H01L 2224/45124* (2013.01); *H01L 2224/84214* (2013.01); *H01L 2924/00013* (2013.01); *H01L 2924/00014* (2013.01); *H01L 2924/01029* (2013.01); *H01L 2924/1305* (2013.01); *H01L 2924/13055* (2013.01)

(56) References Cited

U.S. PATENT DOCUMENTS

| | | | |
|---|---|---|---|
| 2004/0150082 A1* | 8/2004 | Kajiwara et al. | 257/678 |
| 2009/0236749 A1* | 9/2009 | Otremba et al. | 257/774 |
| 2012/0181682 A1* | 7/2012 | Soyano | 257/692 |
| 2013/0313005 A1* | 11/2013 | Nakamura et al. | 174/255 |
| 2014/0048918 A1* | 2/2014 | Nagaune | 257/675 |
| 2014/0203420 A1* | 7/2014 | Miyasaka et al. | 257/675 |
| 2014/0283618 A1* | 9/2014 | Yasumoto et al. | 73/777 |

FOREIGN PATENT DOCUMENTS

| | | | |
|---|---|---|---|
| JP | 2008-042039 A | | 2/2008 |
| JP | 2008066561 A | * | 3/2008 |
| JP | 2008-098585 A | | 4/2008 |
| JP | 2008-305902 A | * | 12/2008 |
| JP | 2009-190067 A | * | 8/2009 |
| JP | 2010141163 A | * | 6/2010 |
| WO | 2009/081723 A1 | * | 7/2009 |

* cited by examiner

FIG.3
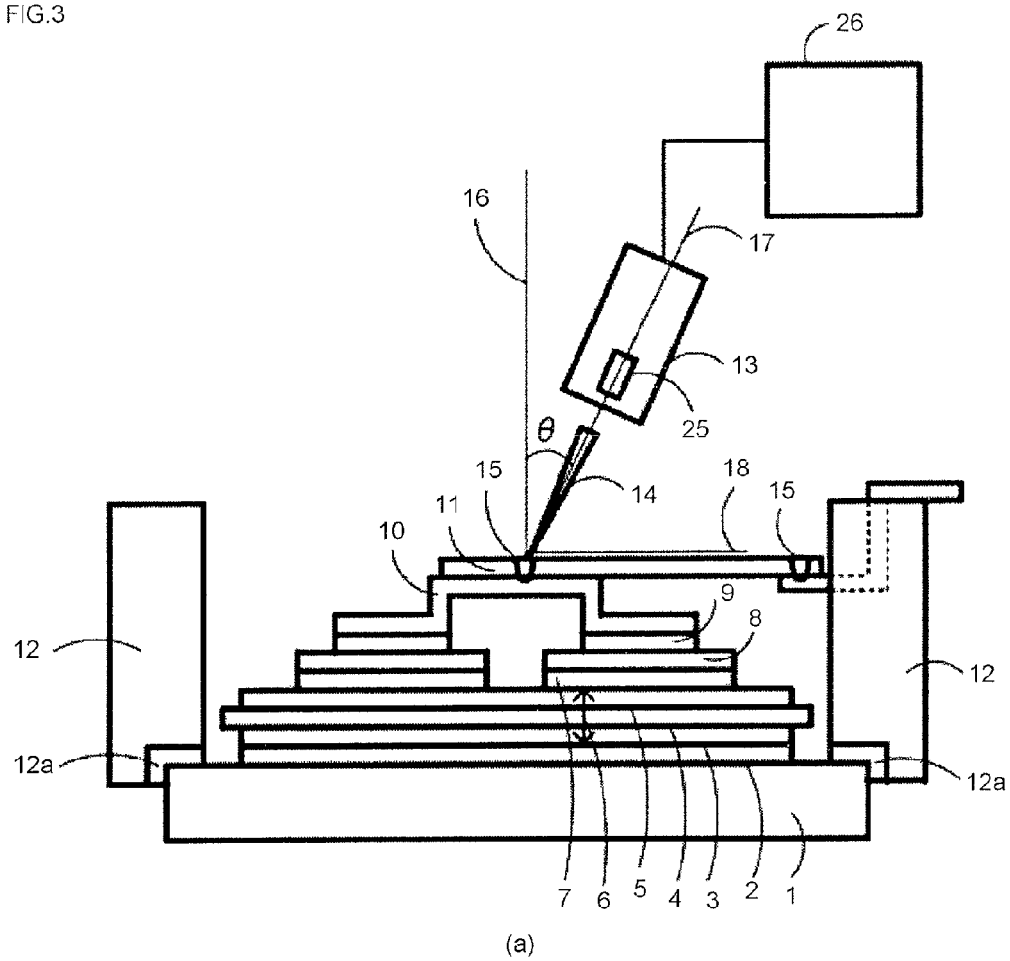
(a)
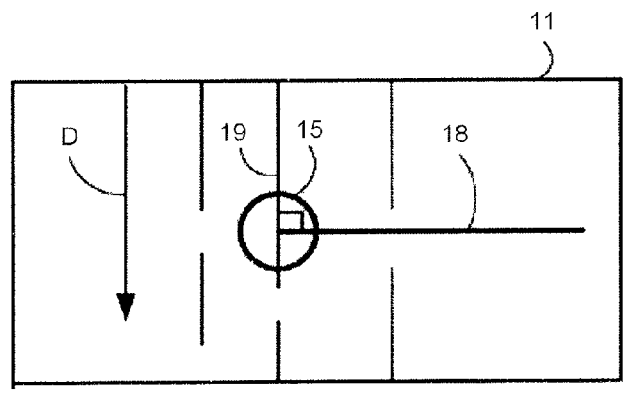
(b)

FIG.14
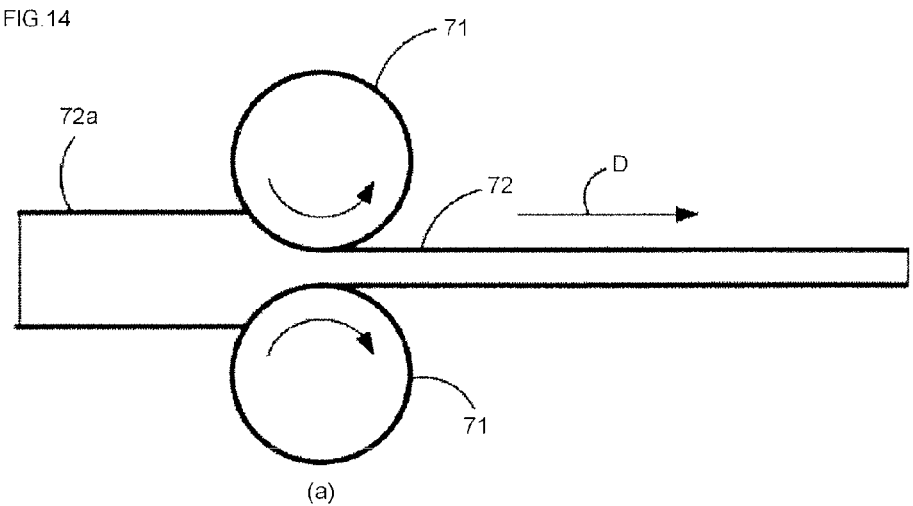
(a)
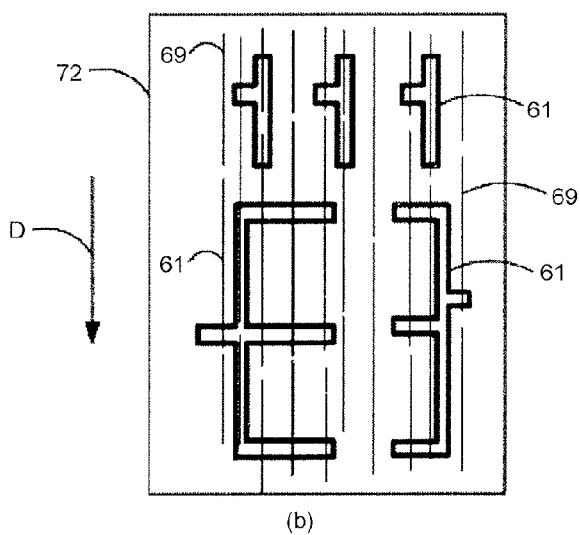
(b)
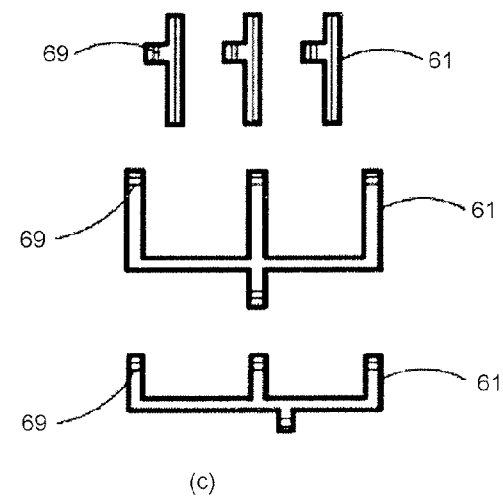
(c)

SEMICONDUCTOR DEVICE WITH SPECIFIC LEAD FRAME FOR A POWER SEMICONDUCTOR MODULE

RELATED APPLICATIONS

The present application is National Phase of International Application No. PCT/JP2011/076141 filed Nov. 14, 2011, and claims priority from Japanese Applications No. 2011-002354 filed Jan. 7, 2011.

TECHNICAL FIELD

The present invention relates to a semiconductor device such as a power semiconductor module, and a method of manufacturing the semiconductor device.

BACKGROUND ART

With the recent reduction in size and increase in capacity of a power semiconductor module, a power semiconductor chip in a power semiconductor module (e.g., an insulated gate bipolar transistor (IGBT)) is therefore operated at high current density. The crucial problem with such power semiconductor module, therefore, is how to dissipate heat generated therein.

Specifically, while an upper limit of the guaranteed temperature is set for a joint temperature Tj of a semiconductor chip in a power semiconductor device such as an IGBT, in a one-sided cooling system in which a semiconductor chip is mounted on a heat dissipating base (copper base plate) with a patterned insulating substrate therebetween, heat dissipation from the upper surface of the semiconductor chip is hardly expected because the upper surface of the semiconductor chip is sealed with sealing resin filling the package. As the heat density increases due to the reduction in size and increase in current of the semiconductor chip, the conventional wiring structure in which an aluminum wire is used as a wiring lead to be connected to an upper surface electrode of the chip for bonding cannot easily reduce the joint temperature of the chip to the upper limit guaranteed temperature or lower. Moreover, combined with Joule heating from the aluminum wire, wire fusing may occur, which brings concern that the power cycle resistance of the semiconductor chip becomes low.

As the means to improve heat dissipation of the upper surface of the semiconductor chip, a lead frame, for example, can be used in place of the aluminum wire. In this case, a lower lead frame is soldered and attached to an upper surface main electrode of the semiconductor chip, and an upper lead frame is disposed on this attached lower lead frame in such a manner as to be superimposed on the ends thereof. A module structure is known in which an upper lead frame and a lower lead frame are laser-welded and attached to each other and used as a heat transfer path to release heat of the semiconductor chip from the upper surface thereof.

FIGS. 11 to 13 are configuration diagrams of a conventional power semiconductor module. FIG. 11 is a plan view showing substantial parts of the conventional power semiconductor module, FIG. 12 is an enlarged view of a section A shown in FIG. 11, and FIG. 13 is a schematic cross-sectional view of substantial parts, taken from line X-X of FIG. 11. FIG. 13 also shows a laser beam.

A power semiconductor module 500 is configured by a heat dissipating base 51, a patterned insulating substrate 56 attached onto the heat dissipating base 51, with a solder 52 therebetween, and a semiconductor chip 58 attached onto a conductive pattern 55 of the patterned insulating substrate 56, with a solder 57 therebetween. In the patterned insulating substrate 56, a conductive film 53 is formed on a rear surface of an insulating substrate 54 and the conductive pattern 55 on a front surface of the same.

The power semiconductor module 500 is also configured by a lower lead frame 60 attached to an upper surface electrode of the semiconductor chip 58 with a solder 59 therebetween, an upper lead frame 61 laser-welded and attached to the lower lead frame 60, a resin case 62 that is attached to the heat dissipating base 51 by a silicone adhesive 62a and fixed, in a penetrating manner, to the lower lead frame 60 serving as an external terminal, and gel, not shown, which fills the resin case 62. The lead frames 60 and 61 are disposed randomly without specifying a direction D of rolling traces 69 (a rolling direction) formed on the lead frames 60 and 61.

The upper lead frame 61 and the lower lead frame 60 are laser-welded and attached to each other as described above, and the attached portions therebetween are electrically connected to configure current paths.

When laser-welding the lower lead frame 60 and the upper lead frame 61 to each other, a laser beam 64 is radiated from a laser emitting unit 63 onto the upper lead frame 61, to melt and solidify the upper and lower lead frames 60 and 61.

The laser beam 64 is radiated at an angle θ of approximately 10° to 15° with respect to a vertical line 66 on the irradiated surface of the upper lead frame 61.

Further, attached portions 65 (laser-welded sections) to be obtained as a result of the radiation of the laser beam 64 are specified by a camera and a light source, not shown, which are installed in the laser emitting unit 63 and a monitor, also not shown, which is installed outside the laser emitting unit 63. Visible light is emitted from the light source. Resultant reflected light from the irradiated surface is captured by the camera installed in the laser emitting unit 63, and the camera transmits a signal corresponding to the reflected light, to the monitor. Through the image displayed on the monitor, the irradiation section can be specified. Because the optical axis of this visible light coincides with an optical axis 67 of the laser beam, the visible light, too, is radiated at an angle θ of approximately 10° to 15° with respect to the vertical line 66 on the irradiated surface.

The number of joining points and joining areas corresponding to the attached portions 65 between the upper lead frame 61 and the lower lead frame 60 are determined in consideration of the conditions under which the power semiconductor module 500 is used (heat generation due to electrification, joint strength in relation to the reliability).

Extra points between the upper lead frame 61 and the lower lead frame 60 are laser-welded in consideration of inconsistent laser welding occurring therebetween.

Patent Documents 1 and 2 disclose the technologies for laser-welding a plurality of lead frames.

Patent Document 3 describes a method of manufacturing a semiconductor device in which a lead frame is roughened for the purpose of reducing the laser welding inconsistency.

Patent Document 1: Japanese Patent Application Publication No. 2008-98585
Patent Document 2: Japanese Patent Application Publication No. 2008-42039
Patent Document 3: Japanese Patent Application Publication No. 2008-28286

FIGS. 14(a)-14(c) show a method of forming a lead frame and FIGS. 14(a) to 14(c) are process diagrams showing respective steps in sequence. First of all, a thick copper plate 72a is rolled with a roll 71 into a copper plate 72 of a predetermined thickness, as shown in FIG. 14(a). Next, a desired lead frame 61 is punched out of the copper plate 72 of the predetermined thickness, as shown in FIG. 14(b) (the upper lead frame is shown in this diagram). Thereafter, the lead frame 61 is removed from the copper plate 72, and a predetermined section of the lead frame 61 is bent (not shown), as shown in FIG. 14(c). As a result of rolling the copper plate 72a, stripe-shaped rolling traces 69 are formed on the surface of the lead frame 61. Because these rolling traces 69 are formed in the rolling direction D, the direction D of the formed rolling traces 69 is same as the direction D in which the rolling is performed (the rolling direction).

As shown in FIG. 12, the direction D of the rolling traces 69 of the upper lead frame 61 lies in a random direction (diagram shows the rolling traces 69 formed in perpendicular and parallel directions) when the upper lead frame 61 is disposed. When radiating visible light to the upper lead frame 61 in order to detect the sections to be laser-welded, the fact that the direction D of the rolling traces 69 of the upper lead frame 61 lies in a random direction intensifies the fluctuations of the intensity of the visible light reflecting off of the irradiated surface. As a result, the visibility of the camera drops, erroneously detecting the sections to be welded.

An Ni-plated layer having a thickness of approximately 10 μm, for example, is formed on the surface of the lead frame 61 (Cu) in order to increase its absorption rate of the laser beam 64.

None of Patent Documents 1 to 3 mentions that the rolling traces of the plurality of lead frames are arranged in the same direction (the rolling direction) to perform laser welding.

DISCLOSURE OF THE INVENTION

An object of the present invention is to solve the problems described above and to provide a semiconductor device capable of improving the visibility of a camera and reducing false detection of sections to be welded, and a method of manufacturing such semiconductor device.

In order to achieve the object described above, an invention according to the first aspect is a semiconductor device including: a heat dissipating base; a patterned insulating substrate attached to the heat dissipating base with a solder therebetween; a semiconductor chip attached to a conductive pattern of the patterned insulating substrate with a solder therebetween; a first conductor attached to the semiconductor chip with a solder therebetween; a resin case attached to the heat dissipating base by an adhesive; and a second conductor attached to the first conductor by laser welding. The second conductor formed by rolling has stripe-shaped rolling traces formed on a surface thereof in a rolling direction and is disposed on the first conductor such that the rolling traces are arranged in a same direction.

In the invention described in the first aspect, according to an invention of the second aspect, an optical axis of a laser beam at the time of the laser welding may be angled with respect to a perpendicular line perpendicular to the surface of the second conductor, and the direction of the rolling traces maybe be made substantially perpendicular to projection axis obtained by projecting the tilted optical axis onto the surface of the second conductor.

In the invention described in the first aspect, according to an invention of the third aspect, the first conductor may be a lower lead frame and the second conductor may be an upper lead frame.

In the invention described in the first aspect, according to an invention of the fourth aspect, the first conductor may be a heat spreader or the conductive pattern.

An invention according to the fifth aspect is a method of manufacturing a semiconductor device including the steps of: radiating visible light to sections to be laser-welded in second conductors; capturing light reflected off of the sections to be laser-welded using a camera; displaying an image from the camera onto a monitor to specify the sections to be laser-welded; and radiating a laser beam onto the specified sections to be laser-welded to laser-weld first conductors and the second conductors together. Rolling traces, which are formed by rolling, of all of the second conductors are arranged in a same direction. An emission optical axis of the visible light substantially coincides with an optical axis of the laser beam. The optical axis of the laser beam is angled with respect to a vertical line vertical to a surface of each of the second conductors. The direction of the rolling traces is made substantially perpendicular to a projection axis formed by projecting the angled optical axis onto the surface of each of the second conductors.

The present invention can reduce the fluctuations of the intensity of the light reflected off of each lead frame by arranging the rolling traces of each lead frame in the same direction (the roiling direction), and therefore can improve the visibility of the camera and reduce false detection on the sections to be welded.

In particular, making the direction of the rolling traces perpendicular to the projection axis of the visible light brings about an effect of reducing the fluctuations of the reflection intensity of the visible light.

The above and other objects, features and advantages of the present invention will become apparent from the following description thereof taken with the accompanying drawings illustrating the embodiment, a preferred example of the present invention.

BRIEF DESCRIPTION OF THE DRAWINGS

FIG. 3 is a schematic cross-sectional view of the substantial parts, taken from line X-X of FIG. 1;

FIGS. 14(a)-14(c) show a method of forming a lead frame and FIGS. 14(a) to 14(c) are a process diagram showing respective steps in sequence.

BEST MODE FOR CARRYING OUT THE INVENTION

Embodiments of the present invention are described hereinafter based on examples.

First Embodiment

Figure 1:
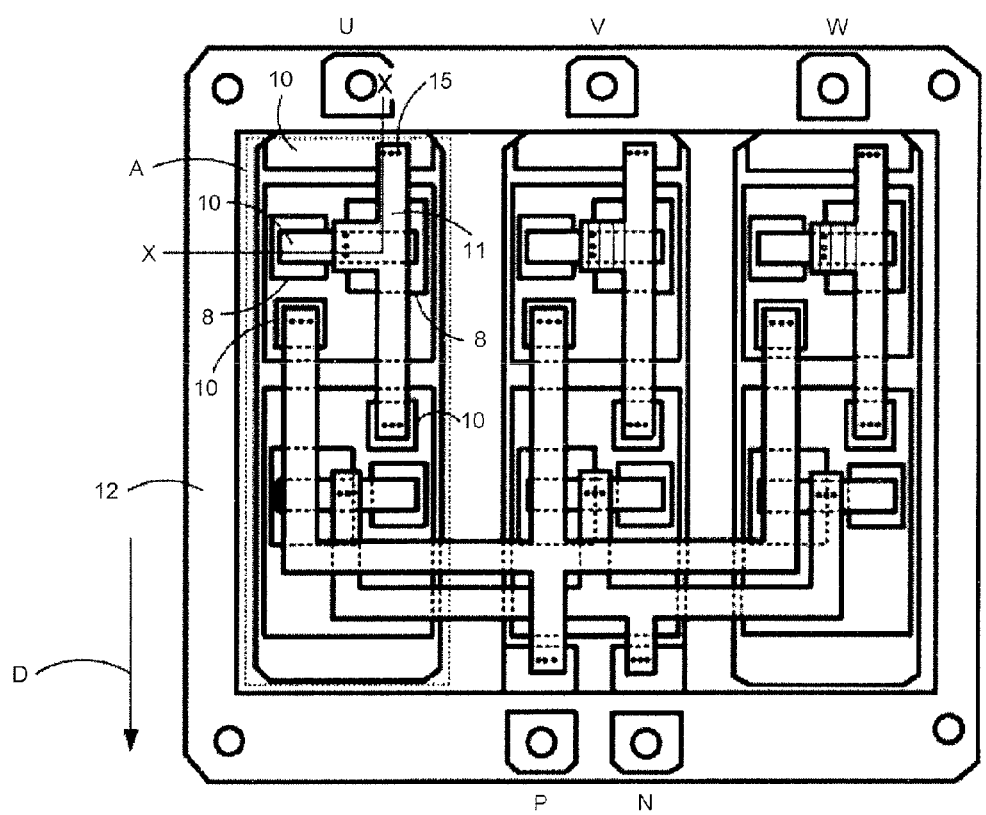
FIG. 1 is a plan view showing substantial parts of a semiconductor device according to the first embodiment of the present invention.
Figure 2:
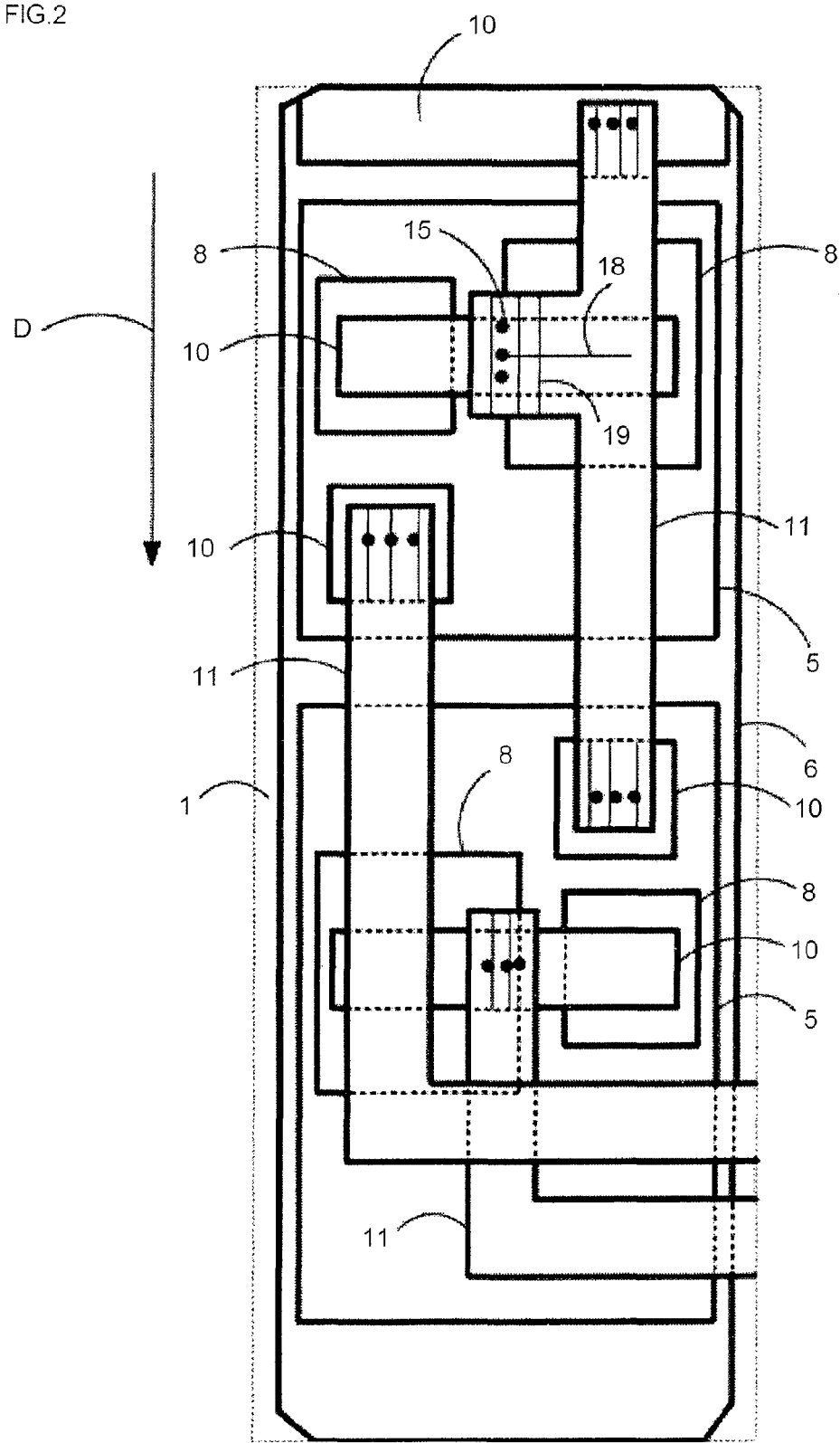
FIG. 2 is an enlarged view of a section A shown in FIG. 1.

FIGS. 1 to 3 are configuration diagrams of a semiconductor device according to the first embodiment of the present invention. FIG. 1 is a plan view showing substantial parts, FIG. 2 is an enlarged view of a section A shown in FIG. 1, and FIG. 3 is a schematic cross-sectional view of the substantial parts, taken from line X-X of FIG. 1. A semiconductor device 100 shown in FIG. 1 is same as the power semiconductor module 500 shown in FIG. 11. In FIG. 1, three identical sections including the section A are arranged side by side, and rolling traces 19 (same as the rolling traces 69 of the power semiconductor module 500) of all lead frames are arranged in the direction of the arrow D. The direction of the arrow D corresponds to the rolling direction, the direction of the rolling traces 19.

The semiconductor device 100 is configured by a heat dissipating base 1, a patterned insulating substrate 6 attached to the heat dissipating base 1 with a solder 2 therebetween, and a semiconductor chip 8 attached to a conductive pattern 5 of the patterned insulating substrate 6 with a solder 7 therebetween. In the patterned insulating substrate 6, a conductive film 3 (conductive foil) is formed on the back of an insulating substrate 4 and the conductive pattern 5 on an upper surface of the same.

The semiconductor device 100 is further configured by a lower lead frame 10 attached to an upper surface electrode of the semiconductor chip 8 with a solder 9 therebetween, an upper lead frame 11 attached by laser welding to the lower lead frame 10, a resin case 12 that is attached to the heat dissipating base 1 by a silicone adhesive 12a and fixed, in a penetrating manner, to the lower lead frame 10 serving as an external terminal, and gel, not shown, which fills the resin case 12.

The upper lead frame 11 and the lower lead frame 10 are attached to each other by laser-welding, as described above, and attached portions 15 therebetween (laser-welded sections) are electrically connected to configure a current path.

The attached portions 15 by which the lower lead frame 10 and the upper lead frame 11 are attached to each other are formed by radiating a laser beam 14 from a laser emitting unit 13 to the upper lead frame 11 and melting and solidifying the upper and lower lead frames 10 and 11.

The laser beam 14 is radiated at an angle θ of approximately 10° to 15° with respect to a vertical line 16 on the irradiated surface of the upper lead frame 11 (the front surface of the upper lead frame 11). Tilting the laser beam 14 in this manner can prevent the upper lead frame 11 from being damaged by reflected light.

Figure 9:
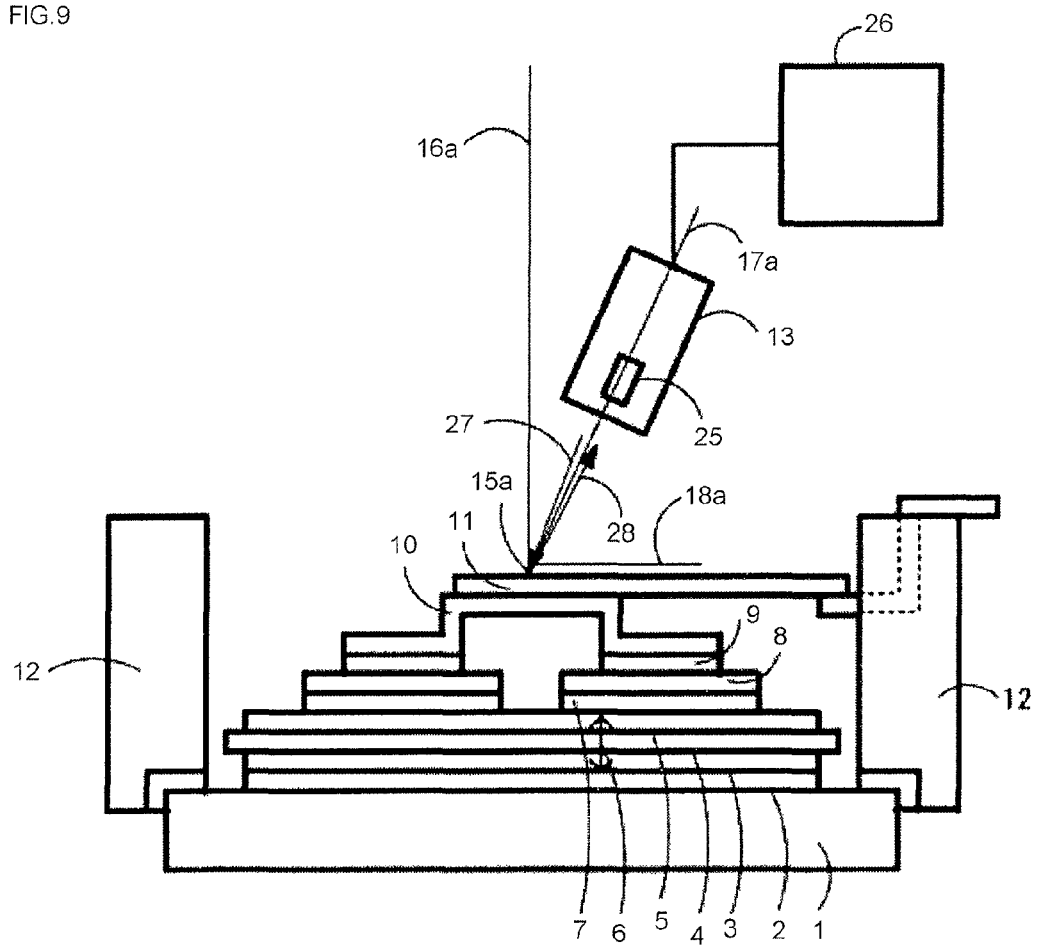
FIG. 9 is a cross-sectional view showing steps of manufacturing the substantial parts of the semiconductor device according to the second embodiment of the present invention, the steps following the steps shown in FIG. 8.
Figure 10:
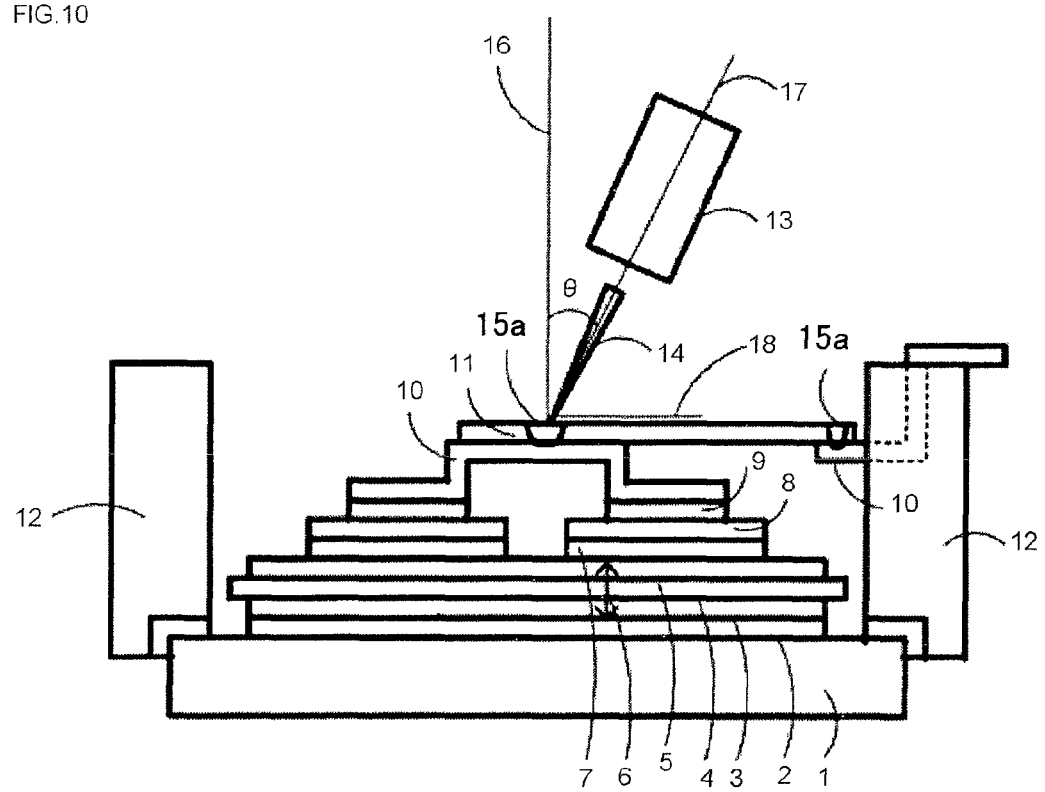
FIG. 10 is a cross-sectional view showing steps of manufacturing the substantial parts of the semiconductor device according to the second embodiment of the present invention, the steps following the steps shown in FIG. 9.

The position of each attached portion 15 where the laser beam 14 is radiated is defined using a camera 25 and an unshown light source which are installed inside the laser emitting unit 13, and a monitor 26 installed outside the laser emitting unit 13. As shown in FIG. 9, visible light (emitted light 27) is emitted from the light source, and thus obtained reflected light 28 from the irradiated surface is captured by the camera installed inside the laser emitting unit 13. A corresponding signal from this camera 25 is transmitted to the monitor 26, and a section to be irradiated is specified by an image displayed on the monitor 26. Because an optical axis 17a of this visible light coincides with an optical axis 17 of the laser beam 14 shown in FIG. 3, the optical axis 17a of the visible light is tilted as well at approximately 10° to 15° to a vertical line 16a of the irradiated surface.

FIG. 2 shows the rolling traces 19 formed along the rolling direction D of the upper lead frame 11. FIG. 3(a) shows the rolling traces 19 along with the laser beam 14, and FIG. 3(b) shows a projection axis 18 of the laser beam 14 on the upper lead frame 11.

Figure 4:
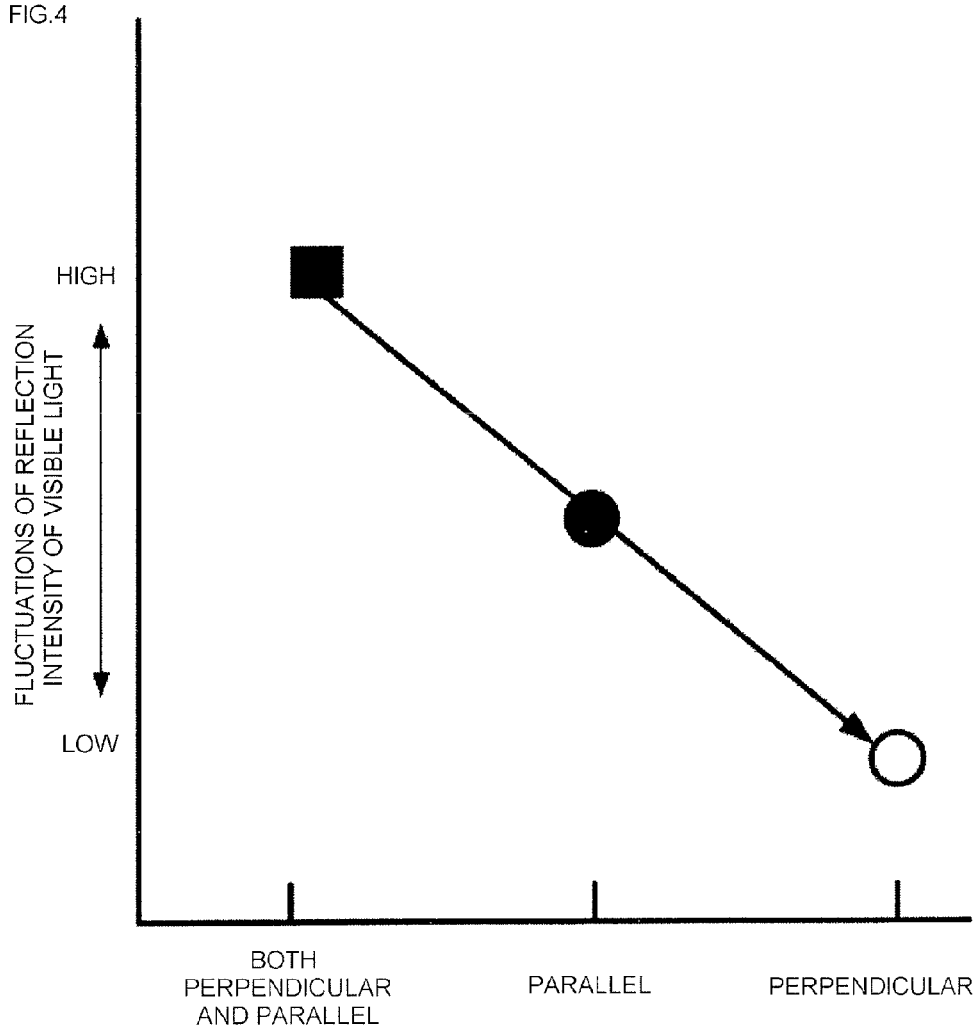
FIG. 4 is a diagram showing a relationship between each direction of rolling traces with respect to a projection axis of visible light and fluctuations in reflection intensity of the visible light.

FIG. 4 is a diagram showing a relationship between each direction of the rolling traces with respect to the projection axis of the visible light and fluctuations in reflection intensity of the visible light. The fluctuations become most prominent when the direction D of the rolling traces 19 lies in both perpendicular and parallel directions as in the prior art, and become least prominent when the direction D of the rolling traces 19 lies perpendicularly.

In FIGS. 1 to 3, the upper lead frame 11 is superimposed on the lower lead frame 10, with all of the rolling traces 19 of the upper lead frame 11 arranged in the direction D. The diagrams show three types of the upper lead frame 11 and three types of the lower lead frame 10. As shown in FIG. 3, the optical axis 17 of the laser beam 14 is projected onto the upper lead frame 11 in such a manner that the direction D of the rolling traces 19 (same as the rolling direction D) becomes substantially perpendicular to the resultant projection axis 18. In doing so, because the optical axis 17a of the visible light coincides with the optical axis 17 of the laser beam 14, a projection axis 18a corresponding to the optical axis 17a of the visible light also becomes substantially perpendicular to the direction of the rolling traces 19. The term "substantially perpendicular" here covers a range of 90°±10°. As described below, the term "substantially perpendicular" is simply referred to as "perpendicular." Note that the projection axis 18 is an axis obtained by projecting the optical axis 17 of the laser beam 14 onto the upper lead frame immediate therebelow, as shown in FIG. 3.

Because the direction D of the rolling traces 19 of each upper lead frame 11 is made perpendicular to the projection axis 18a of the visible light (the optical axis 17a), the intensity of the light reflected off of the irradiated surface of the attached portions 15 fluctuates less, as shown in FIG. 4, improving the visibility of the camera 25. Consequently, false detection of the attached portions 15 can be prevented.

The direction D of the rolling traces 19 (the rolling direction) does not need to be taken into consideration when the directions of the laser emitting unit 13 and the camera 25 or the direction of the semiconductor device 100 (power semiconductor module) can be made variable. However, the configuration of the present invention can eliminate the need for providing a movable mechanism, achieving cost reduction of the device.

The first embodiment has described the example of laser-welding the lead frames 10 and 11 to each other; however, the first embodiment can be applied to a case where the upper lead frame 11 is laser-welded to a heat spreader or to the patterned insulating substrate 6.

The first embodiment has also illustrated the case where the projection axis 18a of the visible light (the optical axis 17a) is perpendicular to the direction D of the rolling traces 19; however, the projection axis 18a may be parallel to the direction D of the rolling traces 19. In other words, arranging the rolling traces 19 in the same direction D can reduce the fluctuations of the intensity of the reflected light of the visible light more than when the direction D of the rolling traces 19 lies in variable directions (in both vertical and parallel directions), as is clear from FIG. 4.

Figure 11:
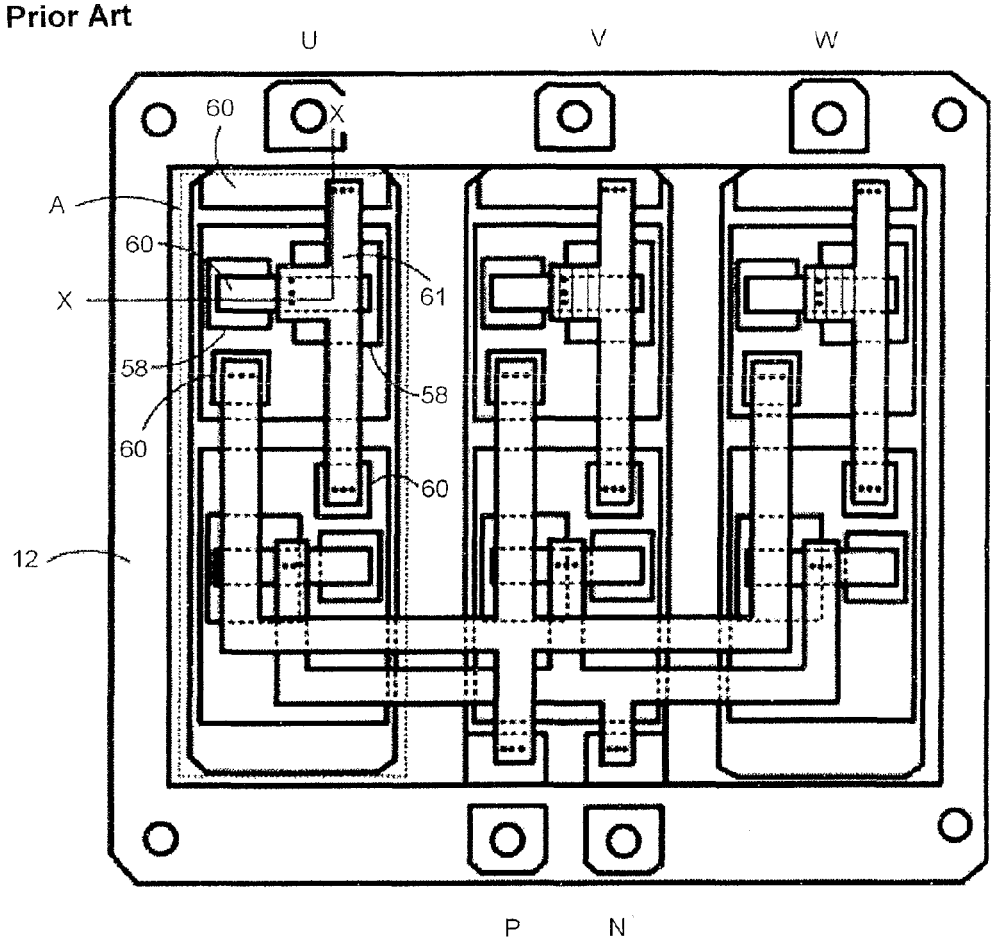
FIG. 11 is a plan view showing substantial parts of a conventional power semiconductor module.
Figure 12:
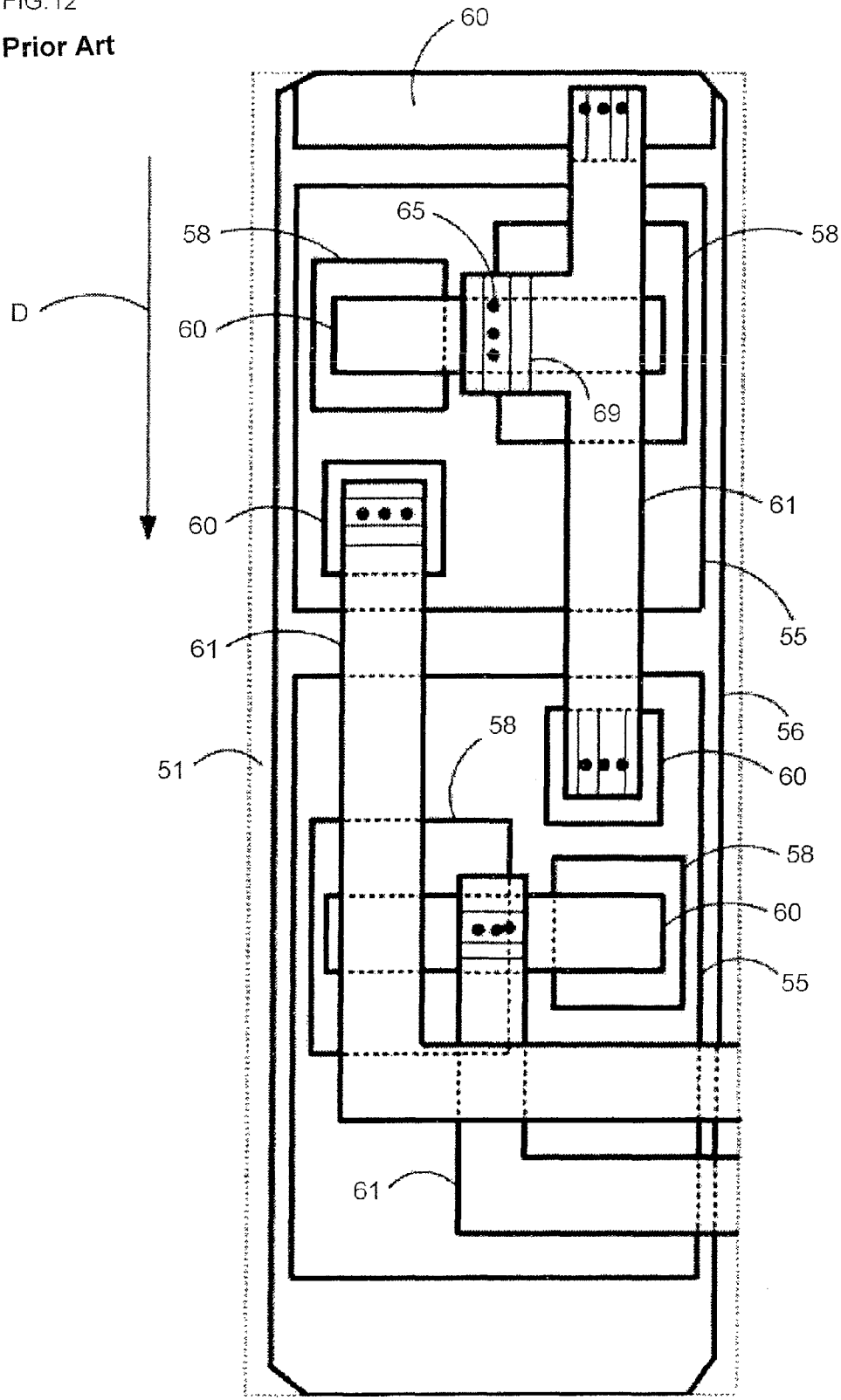
FIG. 12 is an enlarged view of a section A shown in FIG. 11.
Figure 13:
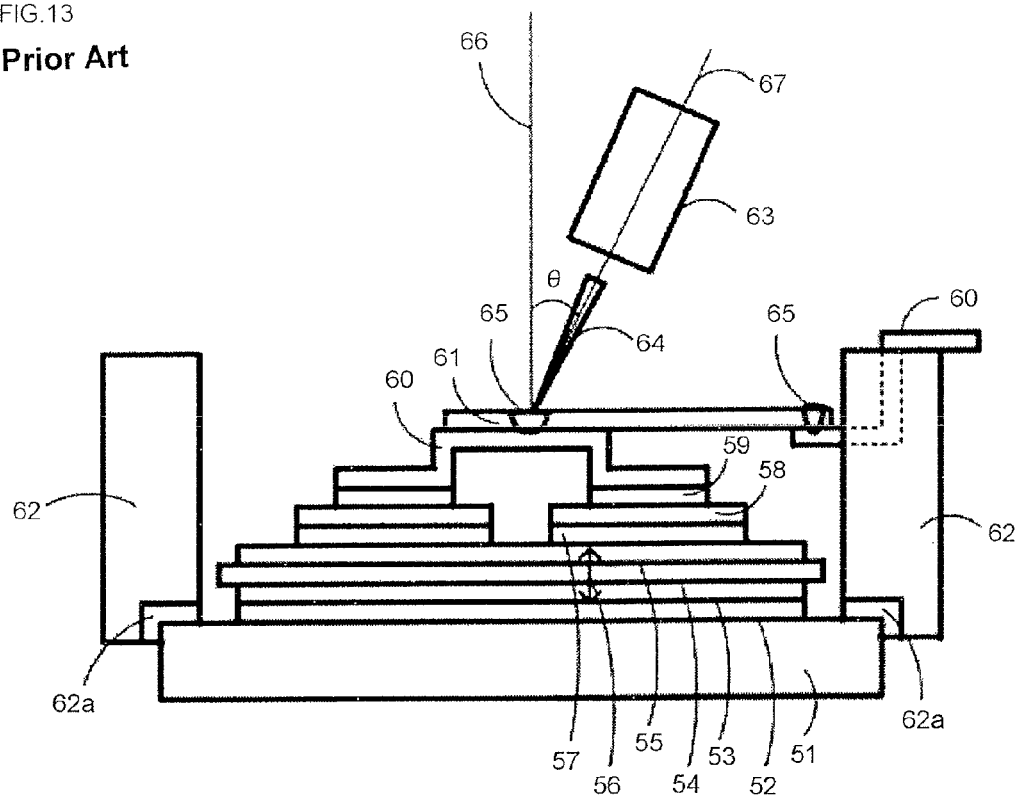
FIG. 13 is a schematic cross-sectional view of substantial parts, taken from line X-X of FIG. 11.

In the conventional power semiconductor module described with reference to FIGS. 11 to 13, laser-welding a large number of upper lead frames 61 and lower lead frames 60 leads to inconsistent welding results with some unwelded sections and/or sections with welding defects. Therefore, in order to reliably secure points to be welded, the number of points to be laser-welded needs to be more than the actual number of welding points, which increases the manufacturing costs. Inconsistent laser welding includes inconsistent weld depth in the attached portions 65, protrusion of molten substances resulting from the welding, and fluctuations in the welded areas.

In the configuration of the present example, unlike this prior art, because the visibility of the camera can be improved by arranging the rolling traces of each lead frame in the same direction (the rolling direction), the laser beam can be absorbed uniformly in each lead frame, and, thus, inconsistent laser welding results can be lowered. As a result, the number of points to be welded can be reduced, lowering the manufacturing costs. Particularly, a great effect of the present invention can be expected when the direction of the rolling traces is perpendicular to the projection axis of the laser beam.

Figure 5:
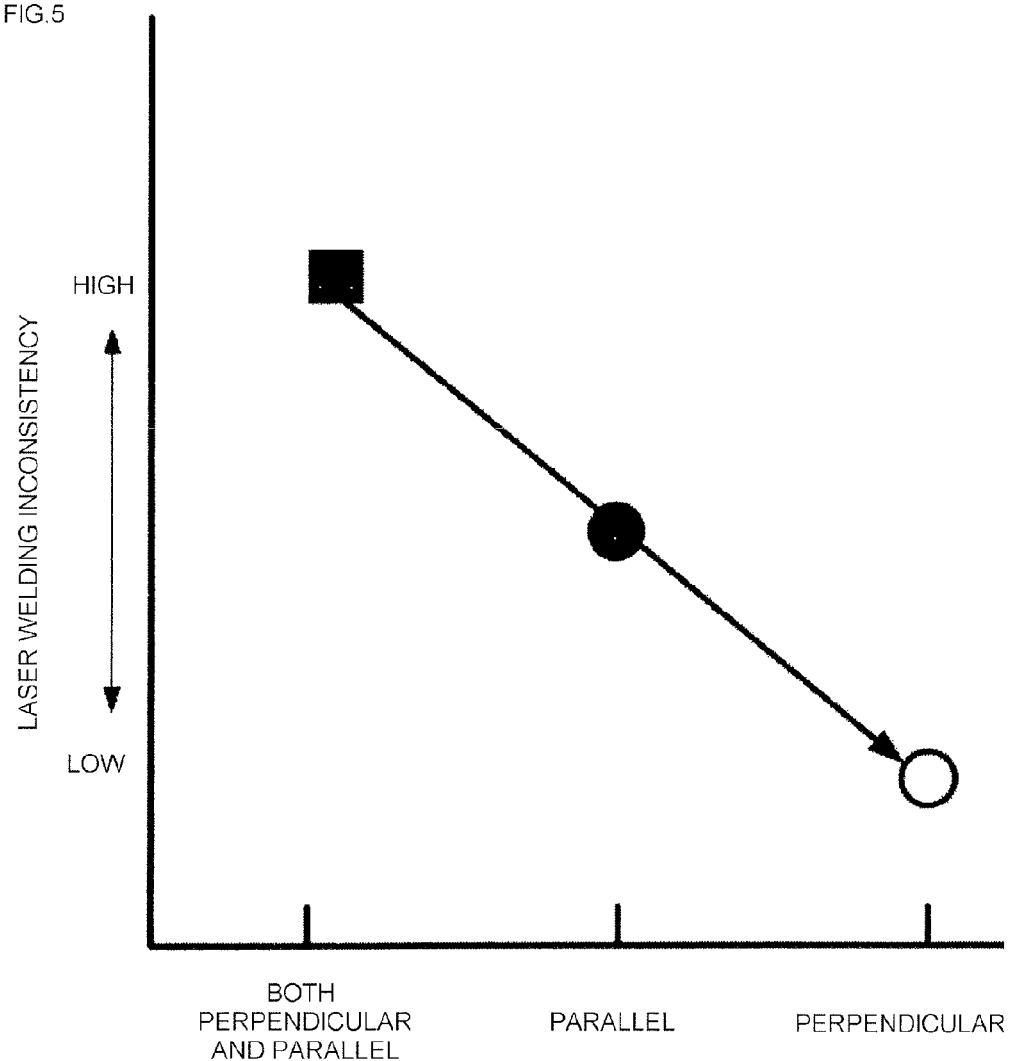
FIG. 5 is a diagram showing a relationship between each direction of the rolling traces with respect to a projection axis of a laser beam and variations of laser welding.

FIG. 5 shows this effect, showing a relationship between each direction of the rolling traces with respect to the projection axis of the laser beam and fluctuations of laser welding. The inconsistency is expected to become most prominent when the direction D of the rolling traces 19 lies in both perpendicular and parallel directions as in the prior art, and least prominent when the direction D of the rolling traces 19 lies perpendicularly.

As shown in FIG. 3, inconsistent laser welding results are expected to decrease by making the direction D of the rolling traces 19 of the upper lead frame 11 perpendicular to the projection axis 18 of the laser beam 14. As a result, the number of points to be welded can be reduced.

Further, the alphabet "P" in the diagram represents a high-potential terminal, "N" a low-potential terminal, "U" a U-phase terminal, "V" a V-phase terminal, and "W" a W-phase terminal.

Second Embodiment

FIGS. 6 to 10 are process diagrams showing a method of manufacturing a semiconductor device according to the second embodiment of the present invention, the process diagrams being cross-sectional diagrams showing steps of manufacturing substantial parts of the semiconductor device.

Figure 6:
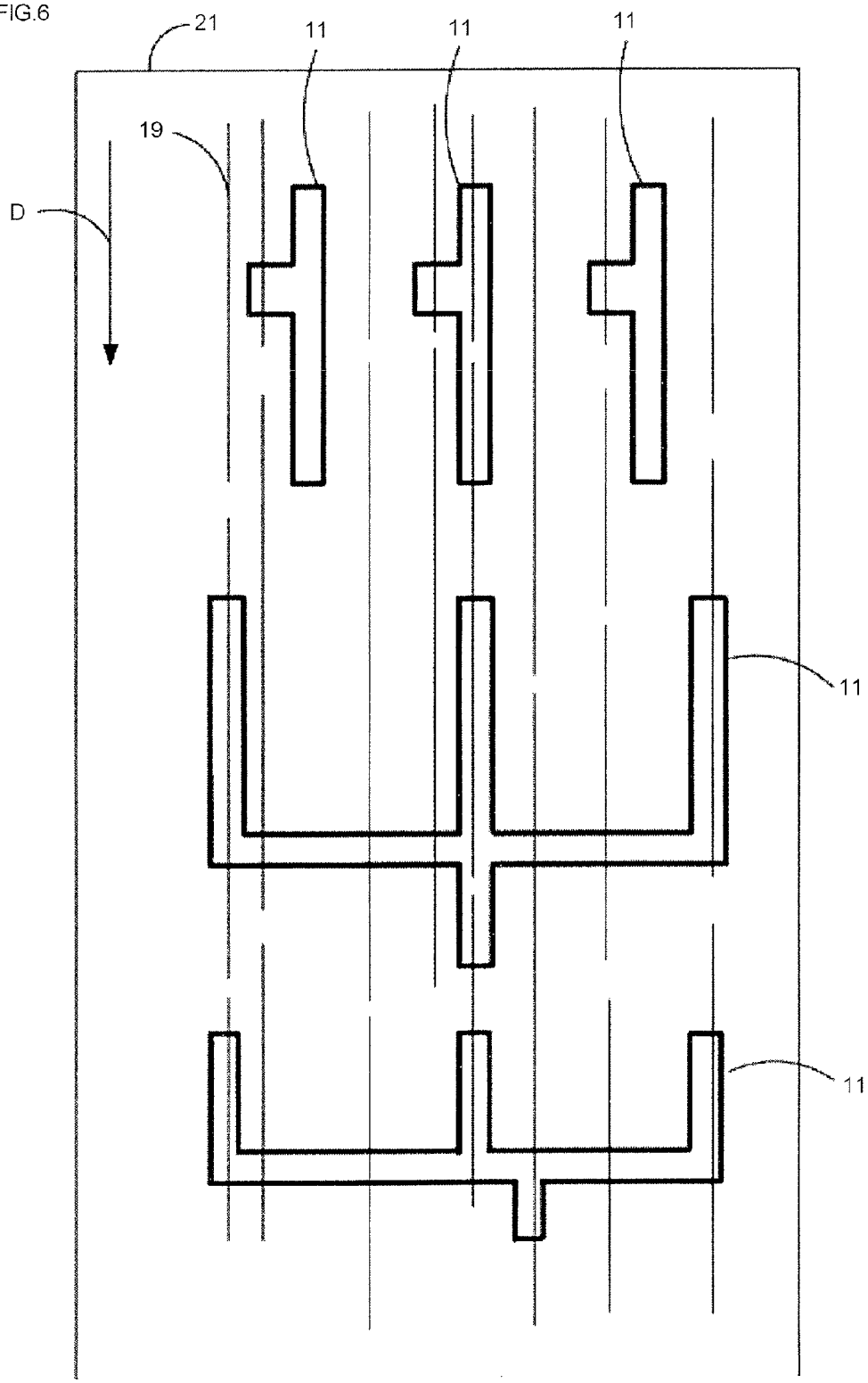
FIG. 6 is a cross-sectional view showing steps of manufacturing substantial parts of a semiconductor device according to the second embodiment of the present invention.
Figure 7:
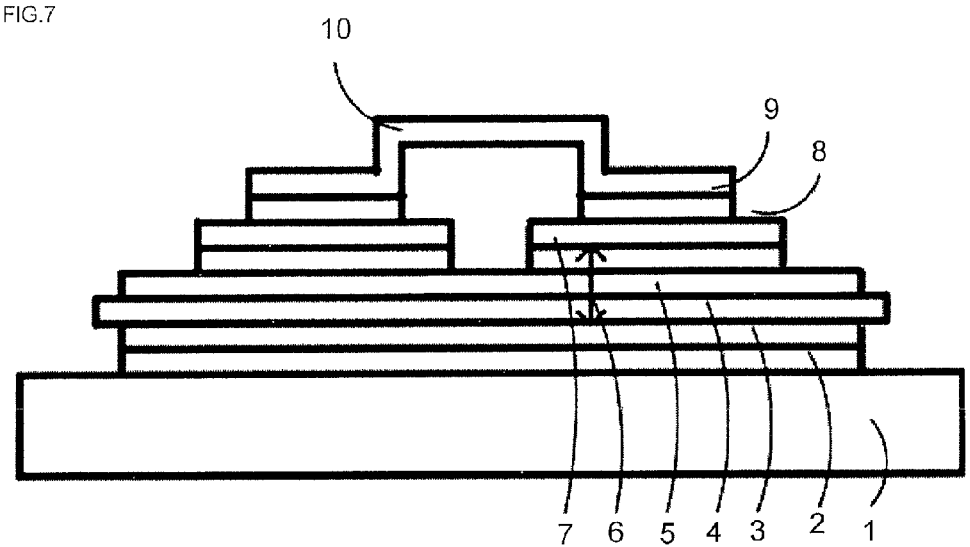
FIG. 7 is a cross-sectional view showing steps of manufacturing the substantial parts of the semiconductor device according to the second embodiment of the present invention, the steps following the steps shown in FIG. 6.

In FIG. 6, upper lead frames 11 are cut out of a rolled copper plate 21. In doing so, the places to dispose the upper lead frames 11 in the semiconductor device 100 (power semiconductor module) are predicted, and all of the upper lead frames 11 (the section A is shown) are cut out in such a manner that the rolling traces 19 are arranged in the same direction D (the rolling direction).

Next, lower lead frames 10 are disposed on a front surface electrode of the semiconductor chips 8. The rolling direction of the lower lead frames 10 may or may not have to be the same as that of the upper lead frames 11 and can be any direction.

Figure 8:
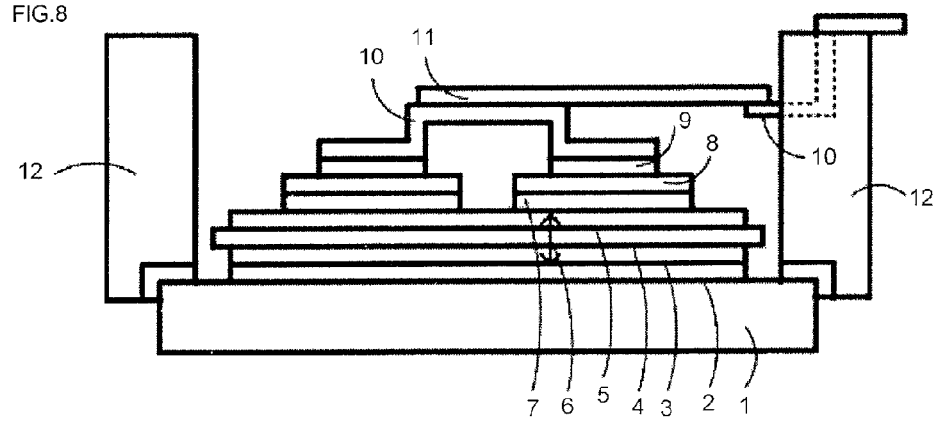
FIG. 8 is a cross-sectional view showing steps of manufacturing the substantial parts of the semiconductor device according to the second embodiment of the present invention, the steps following the steps shown in FIG. 7.

Subsequently, the upper lead frames 11 are disposed on the lower lead frames 10 in such a manner that the rolling traces 19 are arranged in the same direction, as shown in FIG. 8.

Next, visible light is radiated from the light source of the laser emitting unit 13 onto each upper lead frame 11, and thus obtained reflected light 28 from the irradiated surface is captured by the camera 25, as shown in FIG. 9. A corresponding signal from this camera 25 is transmitted to the monitor 26, specifying an attached portion 15a (laser-welded section) to be laser-welded through an image displayed on the monitor 26. As described above, the direction D of the rolling traces 19 is perpendicular to the projection axis 18a of the visible light on the upper lead frame 11.

Next, the laser beam 14 is radiated from the laser emitting unit 13 to the attached portion 15a at an angle θ of approximately 10° to 15° with respect to the vertical line 16 on the surface of the upper lead frame 11, thereby laser-welding the upper lead frames 11 and lower lead frame 10 to each other. As described above, the direction D of the rolling traces 19 is perpendicular to the projection axis 18 of the laser beam 14 on the upper lead frame 11.

By arranging the rolling traces 19 in the same direction D on each upper lead frame 11 and making this direction D of the rolling traces 19 perpendicular to the projection axis 18a of the visible light as described above, the visibility of the camera 25 can be improved and, consequently, false detection of the attached portion 15a can be prevented.

Arranging the direction D of the rolling traces 19 of each upper lead frame 11 in the same direction and making this direction D of the rolling traces 19 perpendicular to the projection axis 18 of the laser beam 14, can not only reduce inconsistent laser welding but also reduce the number of points to be welded.

The foregoing description merely illustrates the principle of the present invention. In addition, various modifications and changes can be made by a person skilled in the art. The present invention is not limited to the precise configurations and applications shown and described above. Accordingly, all suitable modifications and equivalents are considered to fall within the scope of the present invention as defined in the appended claims and their equivalents.

EXPLANATION OF REFERENCE NUMERALS

1 Heat dissipating base
2, 7, 9 Solder
3 Conductive film (conductive foil)
4 Insulating substrate
5 Conductive pattern
6 Patterned insulating substrate
8 Semiconductor chip
10 Lower lead frame
11 Upper lead frame
12 Resin case
12a Silicone adhesive
13 Laser emitting unit
14 Laser beam
15, 15a Attached portion
16, 16a Vertical line
17 Optical axis of laser beam
17a Optical axis of visible light
18 Projection axis of laser beam
18a Projection axis of visible light
19 Rolling trace 25 Camera
26 Monitor
27 Emitted light (visible light)
28 Reflected light (visible light)
D Direction of rolling trace (same as rolling direction)

What is claimed is:

1. A semiconductor device, comprising:
   a heat dissipating base;
   a patterned insulating substrate attached to the heat dissipating base with a solder therebetween;
   a plurality of semiconductor chips attached to a conductive pattern of the patterned insulating substrate with a solder therebetween;
   a plurality of first conductors attached to the semiconductor chips with a solder therebetween;
   a resin case attached to the heat dissipating base with an adhesive; and
   a plurality of second conductors attached onto the first conductors,
   wherein each of the second conductors has stripe-shaped traces formed on a surface thereof in one direction, and is disposed on each of the first conductors such that the traces on the plurality of second conductors are arranged in the one direction.

2. The semiconductor device according to claim 1, wherein each of the first conductors is a lower lead frame and each of the second conductors is an upper lead frame.

3. The semiconductor device according to claim 1, wherein each of the first conductor is a heat spreader or the conductive pattern.

4. The semiconductor device according to claim 2, wherein the traces are formed at least a portion where the first and second conductors are connected.

* * * * *

UNITED STATES PATENT AND TRADEMARK OFFICE
CERTIFICATE OF CORRECTION

| | | |
|---|---|---|
| PATENT NO. | : 9,136,209 B2 | Page 1 of 1 |
| APPLICATION NO. | : 13/978456 | |
| DATED | : September 15, 2015 | |
| INVENTOR(S) | : Toshiyuki Miyasaka | |

It is certified that error appears in the above-identified patent and that said Letters Patent is hereby corrected as shown below:

Specification

Please change column 4, line 21, from "… the roiling direction …" to --… the rolling direction …--.

Please change column 6, line 6, from "camera installed …" to --camera 25 installed …--.

Signed and Sealed this
Second Day of February, 2016

Michelle K. Lee
*Director of the United States Patent and Trademark Office*